(12) United States Patent
Tashiro

(10) Patent No.: US 6,559,452 B1
(45) Date of Patent: May 6, 2003

(54) IMAGE INPUT APPARATUS

(75) Inventor: Kazuaki Tashiro, Hadano (JP)

(73) Assignee: Canon Kabushiki Kaisha, Tokyo (JP)

( * ) Notice: Subject to any disclaimer, the term of this patent is extended or adjusted under 35 U.S.C. 154(b) by 131 days.

(21) Appl. No.: 09/631,706

(22) Filed: Aug. 3, 2000

(30) Foreign Application Priority Data

Aug. 4, 1999 (JP) ............................................. 11-221406
Jul. 13, 2000 (JP) ....................................... 2000-212812

(51) Int. Cl.[7] ............................... G01T 1/24; G01T 1/20
(52) U.S. Cl. ................... 250/370.09; 250/366; 250/367
(58) Field of Search ........................ 250/370.09, 370.08, 250/366, 367

(56) References Cited

U.S. PATENT DOCUMENTS 5,629,524 A * 5/1997 Stettner et al. ........ 250/370.09
5,834,782 A * 11/1998 Schick et al. ............ 250/208.1
6,175,611 B1 * 1/2001 Melen et al. ................ 250/332

* cited by examiner

*Primary Examiner*—Constantine Hannaher
*Assistant Examiner*—Albert Gagliardi
(74) *Attorney, Agent, or Firm*—Fitzpatrick, Cella, Harper & Scinto

(57) ABSTRACT

An image input apparatus having a plurality of sensors each including a pixel area in which a plurality of pixels are arranged, is provided. The image input apparatus includes: a first group including one or a plurality of pixel areas; and a second group including a plurality of pixel areas arranged adjacently to each other surrounding one or the plurality of pixel areas of the first group, as viewed along an image input direction, wherein the plurality of pixel areas of the second group are arranged nearer to an image input surface than one or the plurality of pixel areas of the first group.

17 Claims, 13 Drawing Sheets

X-RAY →

*PRIOR ART*

X-RAY
IMAGE INPUT PLATE

| NUMBER OF GROUP | 1 | 2 | 3 | 4 | n-1 | n |
|---|---|---|---|---|---|---|
| NUMBER OF SIDES | 1 | 3 | 5 | 7 | 2n-3 | 2n-1 |
| NUMBER OF MODULES IN GROUP | 1 | 8 | 16 | 24 | 8(n-2) | 8(n-1) | a=137mm (VIEWED FROM THE BACK)

↑ X-RAY

↑ X-RAY

X-RAY

IMAGE INPUT APPARATUS

BACKGROUND OF THE INVENTION

1. Field of the Invention

The present invention relates to an image input apparatus for inputting an object image by using a plurality of sensors.

2. Related Background Art

In the field of medical equipment, apparatuses capable of providing high diagnosis efficiency and high precision have been desired. Although X-ray imaging apparatuses using films have been the main trend, demands for processing digital X-ray image data are becoming high. For example, X-rays transmitted through an object is projected upon an X-ray imaging apparatus and displayed on a display device for real time diagnosis.

Digital X-ray image data can be managed by using a recording medium such as a magnetooptical disk. Digital X-ray image data of a patient can be transmitted to a remote site by various communication methods, and the image can be monitored in real time at the remote site.

Diagnosis more precise than conventional can be achieved through image processing of digital X-ray image data. Disadvantages associated with a conventional film type can be solved. Digital X-ray image data is being used not only in the medical field but also in the industrial field. For example, a digital X-ray image input apparatus is used for crystalline analysis of materials, and research in use of an X-ray semiconductor-exposure system for manufacturing and monitoring semiconductor devices with ultra fine patterns on a semiconductor wafer is also being done.

In place of an X-ray imaging apparatus using films, an image input apparatus using a two-dimensional CCD solid state image sensing device has been developed to attain digital X-ray image data processing.

A flat panel sensor has been developed which has a large substrate on which photoelectric conversion element layer made of amorphous silicon (a-Si) hydride are formed. An X-ray imaging apparatus using such a flat panel sensor is also under development.

Since a-Si can be used as material of both photoelectric conversion elements and thin film transistors (TFT), photoelectric conversion elements and TFTs can be easily formed on the same substrate. A large area sensor of an equal magnification type using a combination of a scintillator, TFTs and photoelectric conversion elements has been studied.

An X-ray image input apparatus of a flat panel type has been desired which has a large image area and a high sensitivity and which is compact, light, and compatible with high speed moving images. It is desired that the pixel pitch of such an X-ray image input apparatus is 100 $\mu$m or smaller and that the effective image area of photoelectric conversion pixels is at least 40 cm×40 cm for sensing an image of a human chest.

Problems associated with conventional X-ray image input apparatuses of a large screen type are given in the following.

A CCD solid image sensing device having a size as large as a human body is impossible at present. A currently available size of a CCD sensor is 2 cm square. Therefore, in order to input a large area image to the CCD solid image sensing device, it is necessary to reduce the size of a fluorescent image, i.e., X-ray image, from a scintillator by using an optical reduction system and to focus the image upon a CCD light reception surface.

With a CCD sensor using an optical reduction system, however, an S/N ratio of an image is lowered by two to three digits because the image passes through a lens, although it depends on a reduction factor. Therefore, such a CCD sensor is not suitable for use with medical apparatuses which require high image gradation.

An X-ray imaging apparatus having a plurality of combinations of an optical reduction system and a CCD solid state image sensing device has been proposed which can provide a large image area while retaining a high S/N ratio. The sensitivity is, however, inferior to an equal magnification type, and the size of the X-ray imaging apparatus becomes large because lens systems are incorporated.

A CCD solid state image sensing device made of single crystal silicon and electronic components used as its peripheral circuit are likely to be affected by X-rays, and thus X-ray shielding is required.

A CCD solid state image sensing apparatus such as shown in FIG. 1 is known which is made of a combination of a CCD sensor, a fiber plate of an equal magnification optical system and a scintillator. This CCD sensor has: a pixel area 82 made of four modules; a non-pixel area 83 in which vertical and horizontal scan circuits, an image processing circuit and the like are formed; and an electrical mounting area 84 around the non-pixel area in which lead connectors and the like are mounted. However, with this structure, the maximum number of CCD modules is only four and a large area is hard to be realized.

In order to make a larger area, U.S. Pat. No. 5,834,782 proposes an image input apparatus shown in FIGS. 2A and 2B. FIG. 2A is a perspective view of the apparatus and FIG. 2B is a plan view thereof as viewed along an X-ray incidence direction. A plurality of area sensors 91 of CCD sensors or CMOS sensors are arranged with facing incident X-rays and on different steps so as to overlap with each other in a peripheral area. X-rays become incident and are introduced via a fiber array to the pixel area 94. Each area sensor 91 has the pixel area 94 and a signal output area (non-pixel area) 93 which is formed one side of the sensor. A fiber array 92 has steps on which the area sensors 91 are arranged. If the number of steps of the fiber array 92 is increased, a large number of area sensors or modules can be used theoretically. With this structure, however, a read/scan circuit for the area sensor is required to be formed on one side of the sensor. Therefore, electrical mounting areas (non-pixel areas) are concentrated on two sides among four sides of the panel, and the other two sides are not used effectively. It is therefore difficult to form a compact image input apparatus. This becomes a critical issue when a number of area sensors of a small size are used.

If a flat panel type is used, a large image area of an equal magnification without an optical reduction system becomes possible. An S/N ratio is better than a CCD solid state image sensing device with an optical reduction system.

Since an optical reduction system is not used, the apparatus can be made more compact and is suitable for use in a hospital or medical examination vehicle which does not have a large space.

Although the flat panel made of four modules such as shown in FIG. 1 is widely used, the number of modules is four at a maximum. It is difficult to use modules more than four to form a panel of large area. With this structure, coupling areas between modules are inevitably positioned in the central area of the panel. This central area is often used to obtain image data. If this coupling areas form any image defects, these defects become visually conspicuous and the image quality is degraded considerably.

It is difficult to realize higher sensitivity and higher operation speed of a flat panel using a-Si TFTs and a-Si photoelectric conversion elements, because of restrictions specific to a-Si semiconductor. A flat panel having high sensitivity and high operation speed and compatible with moving images has therefore been considered difficult to manufacture.

SUMMARY OF THE INVENTION

It is an object of the invention to properly dispose a plurality of sensors so that an image of high quality can be obtained.

In order to achieve the above object, aspect of the present invention provides an image input apparatus having a plurality of sensors each including a pixel area in which a plurality of pixels are arranged, the image input apparatus comprising: a first group including one or a plurality of pixel areas; and a second group including a plurality of pixel areas arranged adjacently to each other surrounding one or the plurality of pixel areas of the first group, as viewed along an image input direction, wherein the plurality of pixel areas of the second group are arranged nearer to an image input surface than one or the plurality of pixel areas of the first group.

Another aspect of the invention provides an image input apparatus having a plurality of sensors each including a pixel area in which a plurality of pixels are arranged in a square shape or a rectangle shape, the image input apparatus comprising: a first group including one or a plurality of pixel areas; and a second group including a plurality of pixel areas arranged adjacent to one or the plurality of pixel areas of the first group along four sides of the first group and along four diagonal directions, as viewed along an image input direction, wherein the second group is arranged nearer to an image input surface than the first group.

Other objects and features of the present invention will become apparent from the following detailed description of embodiments when read in conjunction with the accompanying drawings.

DETAILED DESCRIPTION OF THE PREFERRED EMBODIMENTS

Embodiments of the invention will be described in detail with reference to the accompanying drawings.

Figure 1:
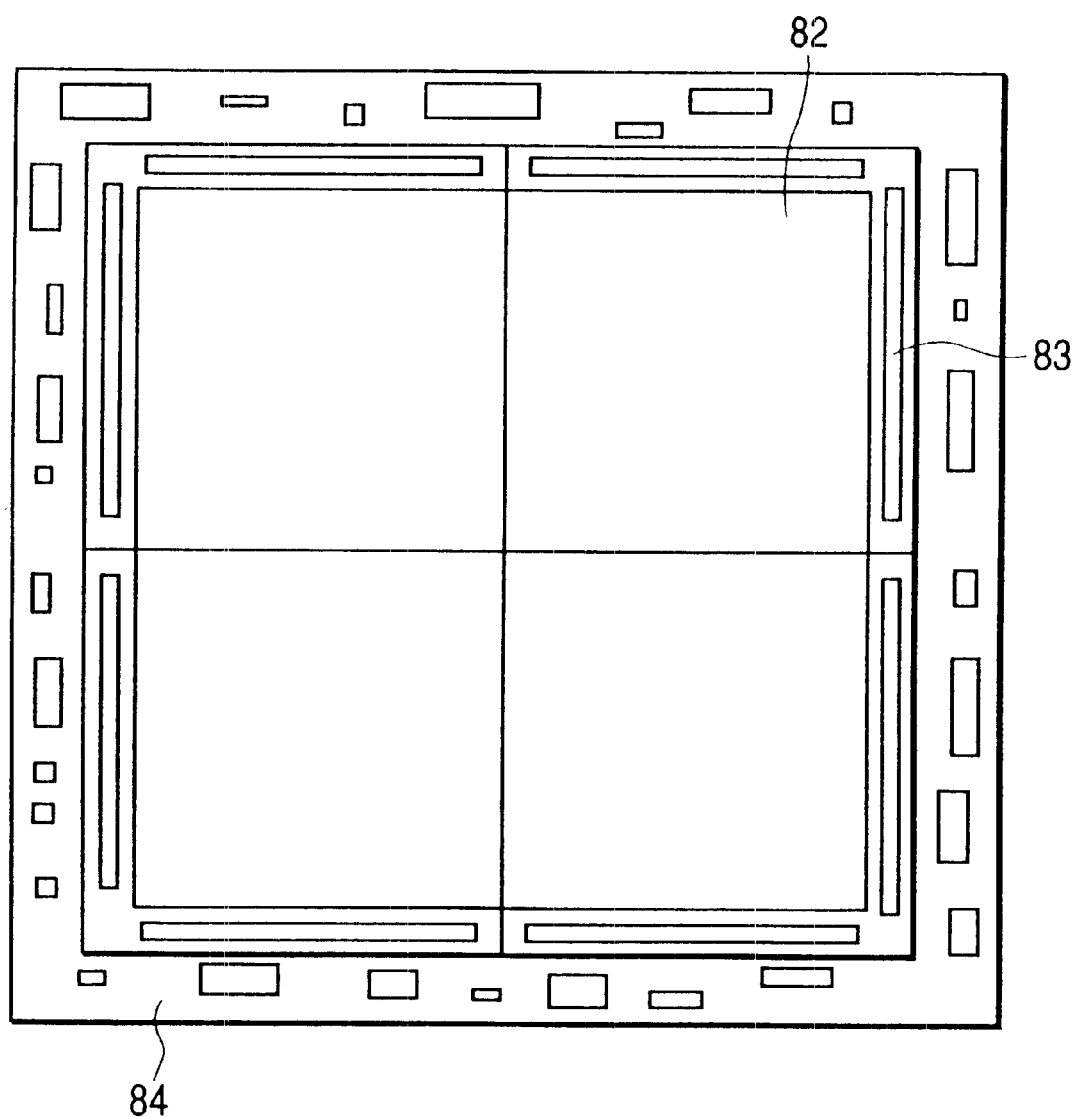
FIG. 1 is a plan view showing a conventional image input apparatus.
Figure 2A:
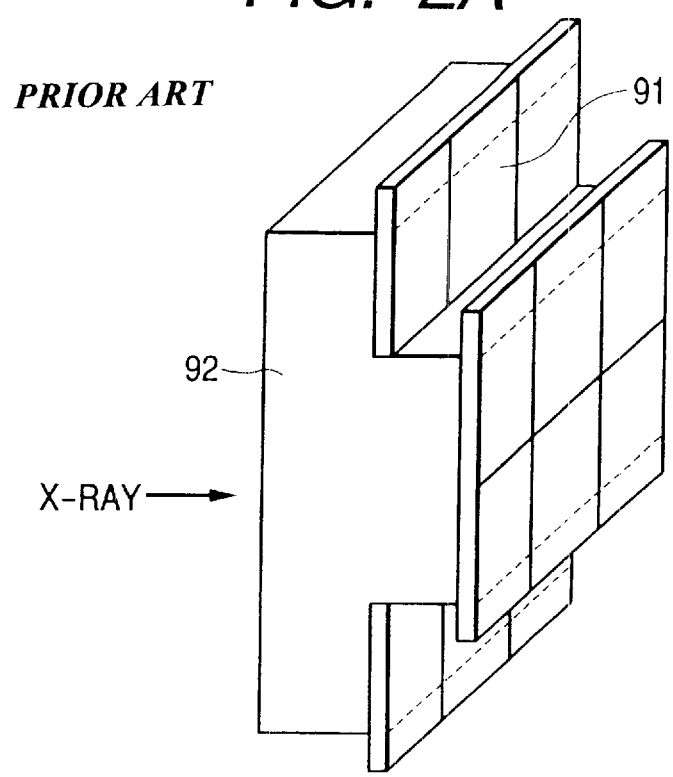
FIGS. 2A and 2B are a perspective view and a plan view showing another conventional image input apparatus.
Figure 2B:
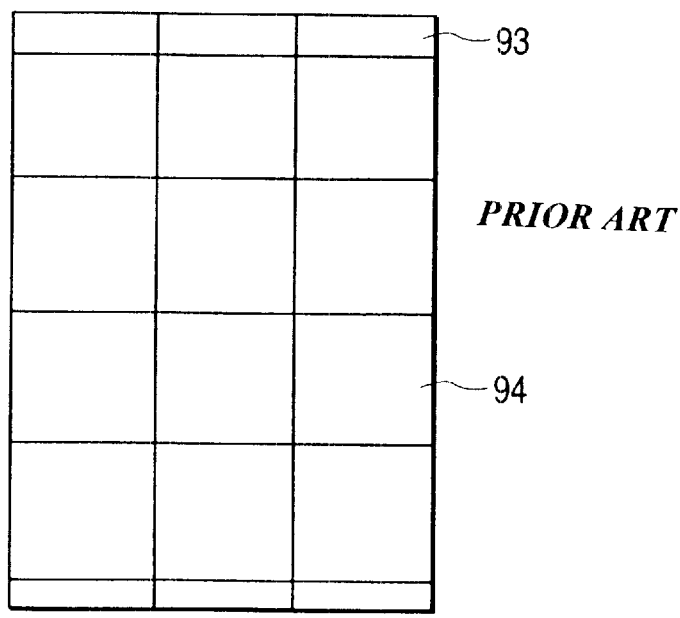
Figure 3A:
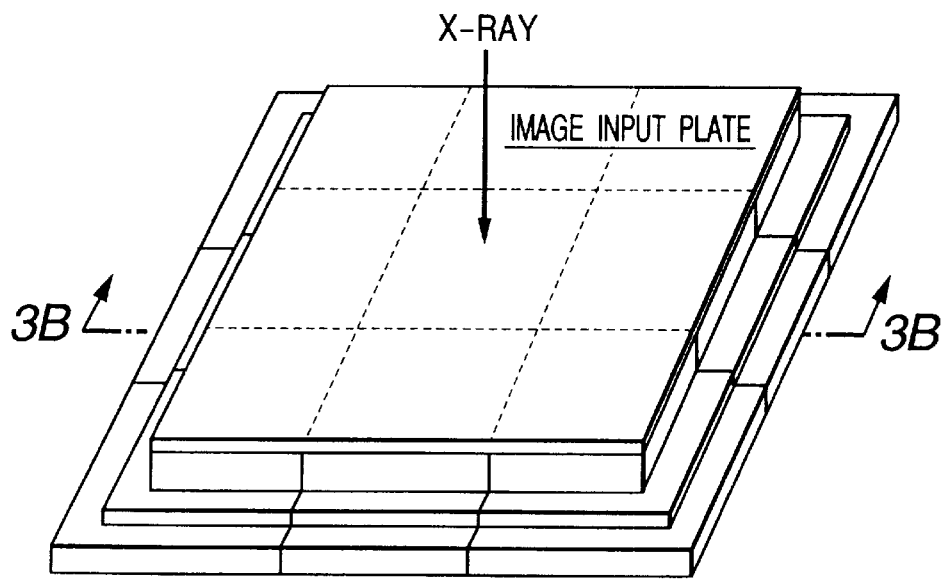
FIGS. 3A and 3B are a perspective view and a cross sectional view showing an image input apparatus according to a first embodiment of the invention.
Figure 3B:
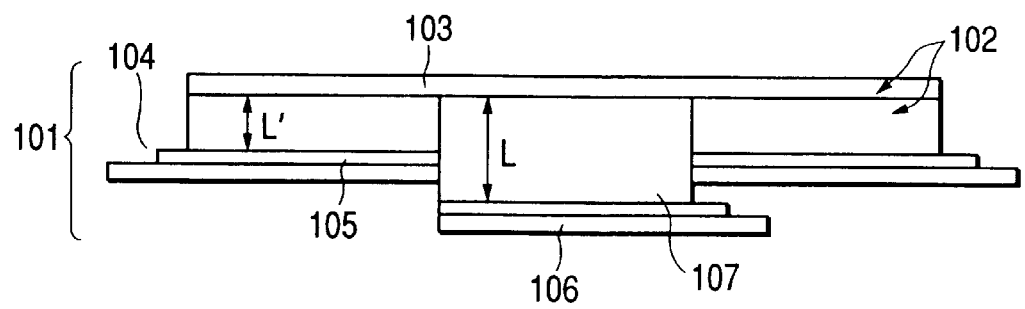
Figure 4A:
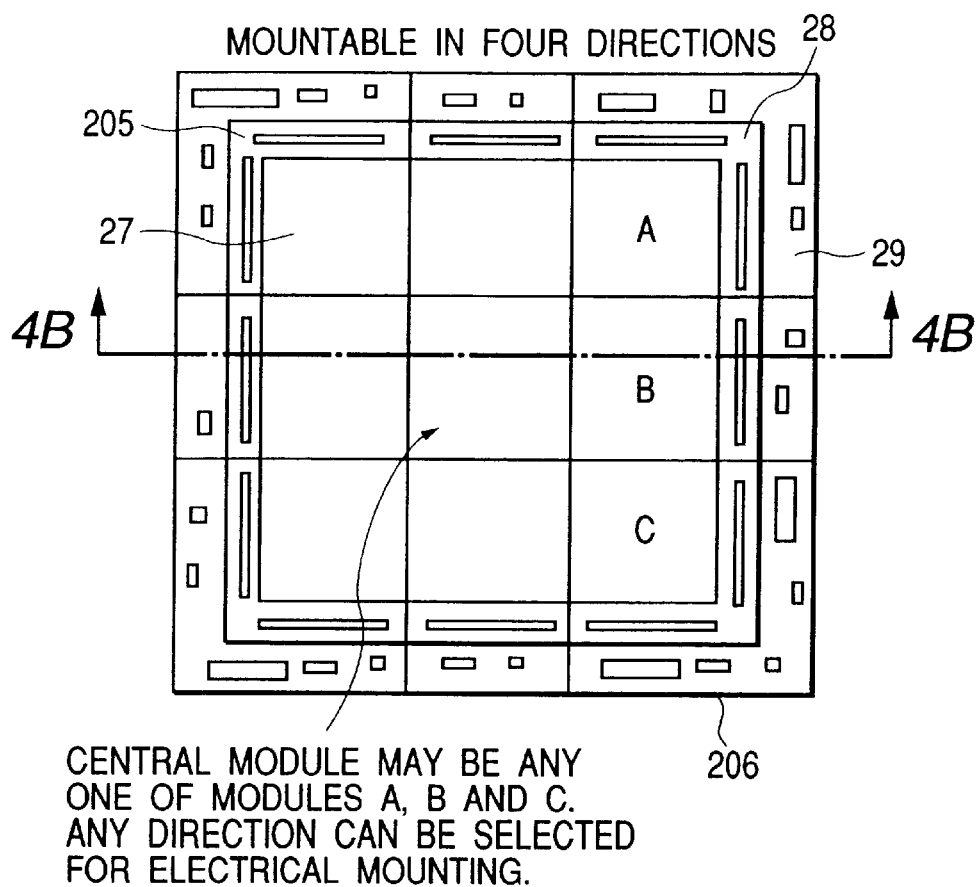
FIGS. 4A and 4B are a plan view and a cross sectional view showing the image input apparatus of the first embodiment.
Figure 4B:
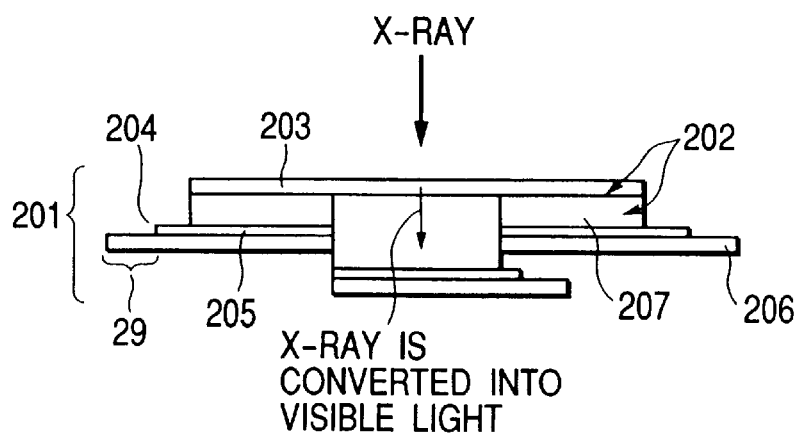

FIGS. 3A and 3B show a two-dimensional image input apparatus according to a first embodiment of the invention. FIG. 3A is a perspective view of the image input apparatus, and FIG. 3B is a cross sectional view taken along a line 3B—3B shown in FIG. 3A. FIGS. 4A and 4B are diagrams showing the structure of modules and illustrating the operation of the image input apparatus of the first embodiment.

Figure 6:
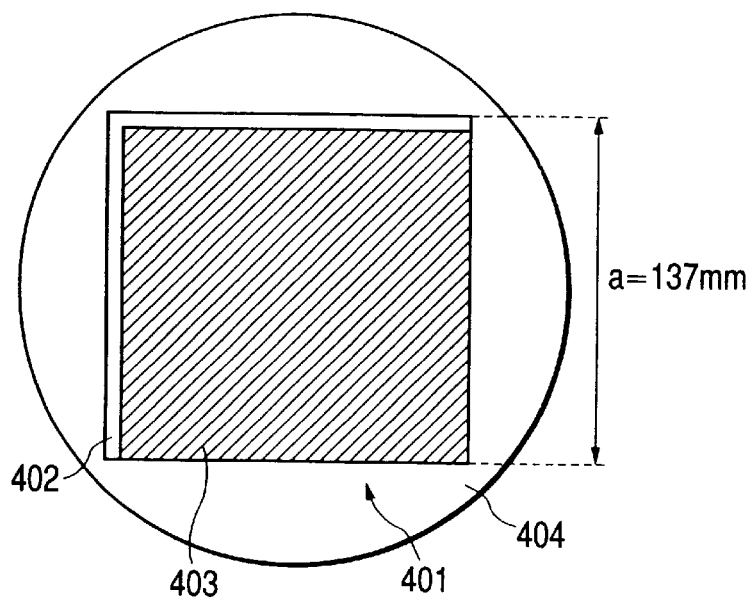
FIG. 6 is a plan view of a wafer with a CMOS area sensor.

In FIG. 3B, reference numeral 105 represents an area sensor including a pixel area in which a plurality of pixels are arranged in vertical and horizontal directions. A CMOS area sensor of generally 140 mm square can be formed from one 8-inch wafer mainly used at present. A wafer with a CMOS sensor is shown in FIG. 6. In FIG. 6, an area sensor 401 has a pixel area 403 and a non-pixel area 402 formed along left and upper two sides, and is cut from an 8-inch wafer 404. The size of each pixel in the pixel area 403 is 100 μm square. Although this pixel size is large, the circuit structure and the like can be designed based on those of a conventional area sensor so that conventional semiconductor manufacture techniques can be incorporated.

Referring to FIG. 3B, X-rays become downward incident upon a scintillator 103 serving as an image input surface, pass through a fiber plate 107 constituting an equal magnification optical system, and enter the area sensor 105 formed on a module substrate 106. A fiber array 102 constituted of the scintillator 103 and fiber plate 107, the area sensor 105, and the module substrate 106 constitute a module 101. A combination of the fiber plate 107 and CMOS area sensor 105 constituting the equal magnitude optical system can realize a sensitivity much higher than a conventional flat panel. Since the area sensor is a single crystal silicon device, it can theoretically operate at high speed.

This embodiment provides a light, compact and high precision X-ray image input apparatus by using the high sensitivity and high speed area sensor 105. Modules with area sensors 105 of three different types are formed. The shape of the pixel area of the area sensor 105 is a square of m×m (in this embodiment, m=1350). The shape is not limited only to a square, but other shapes such as a rectangle may also be used.

In this embodiment, modules of three types A, B and C are used. FIGS. 4A and 4B show the structure of each module and its electrical mounting. The arrangement of these modules A to C is a typical example of the whole structure of this embodiment. FIG. 4A is a plan view showing a combination of 3×3 modules including the modules A to C, and FIG. 4B is a cross sectional view. In FIGS. 4A and 4B, each module 201 is constituted of a module substrate 206, an area sensor 205, a fiber array 202 and the like. Of the modules A to C of different types shown in FIG. 4A, the module A has a pixel area 27, a non-pixel area 28 and an electrical mounting area 29, respectively formed on its module substrate 206. The non-pixel area is formed along two sides of the module substrate crossing at a right angle, in which area a vertical scan circuit for selecting pixels in the vertical direction, a horizontal scan circuit for selecting pixels in the horizontal direction, and the like are formed. The electrical mounting area 29 is formed with a signal processing circuit and the like for processing signals from the area sensor 205 and supplying the processed signals to an external circuit. The module B has a pixel area 27, a non-pixel area 28 formed along one side of the module substrate 206, and an electrical mounting area 29. The module C has a pixel area 27, a non-pixel area 28 and an electrical mounting area 29, formed along two sides of the module substrate crossing at a right angle, respectively. The central module among the nine modules may be any one of the three modules A to C, and any direction can be selected for its electrical mounting. The pixel area and non-pixel area constitute the area sensor.

In the structure shown in FIG. 4B, the fiber array 202 is constituted of a scintillator 203 and the fiber plate 207. The scintillator 203 converts X-rays into visual light and covers the pixel area 207 as viewed along an X-ray incoming direction. The area sensor 205 on the module substrate 208 is electrically connected to the electrical mounting area 29 through wire bonding 204.

In this embodiment, the fiber array 202 is intended to mean a combination of the scintillator 203 serving as the image input surface and the fiber plate 207 made of a number of optical fibers to constitute an equal magnification optical system. In the electrical mounting area 209 of the module substrate, a circuit for processing signals from the area sensor 205 and other circuits are formed as hybrid circuits. Also in this area 209, bonding pads are formed for electrical connections between these circuits and the power source lines, signal lines and the like of the area sensor 205.

The modules A and C are arranged at each corner of the image input surface. The module B is arranged between the modules A and C. In this embodiment, these modules are combined to form a 3×3 array as shown in FIG. 4A which array is a typical example of the whole structure of the embodiment.

The central module belongs to a first group, and the peripheral eight modules belong to a second group. The feature of this embodiment resides in the module layout that one module is arranged in the central area. The modules of the second group are arranged along the four sides of the pixel area of the central module of the first group. In this case, each module is arranged so that the vertical pixel lines and horizontal pixel lines become continuous as viewed along the X-ray incidence direction (image input direction). The modules of the second group are arranged on the same plane which is different from the plane on which the central module of the first group is arranged.

In this embodiment, the thickness of the fiber array of each module is made different (L>L' as shown in FIG. 3B). Therefore, the central module of the first group is arranged at the lower position as shown in FIG. 4B of the cross sectional view of a display panel with these modules. Only the method of stepwise arranging area sensors or modules is well known techniques. The electrical mounting area with a read circuit and bonding pads can be arranged separately for each pixel area, while all pixel areas are arranged continuously over the whole panel area. Therefore, electrical mounting becomes easy.

Figure 5:
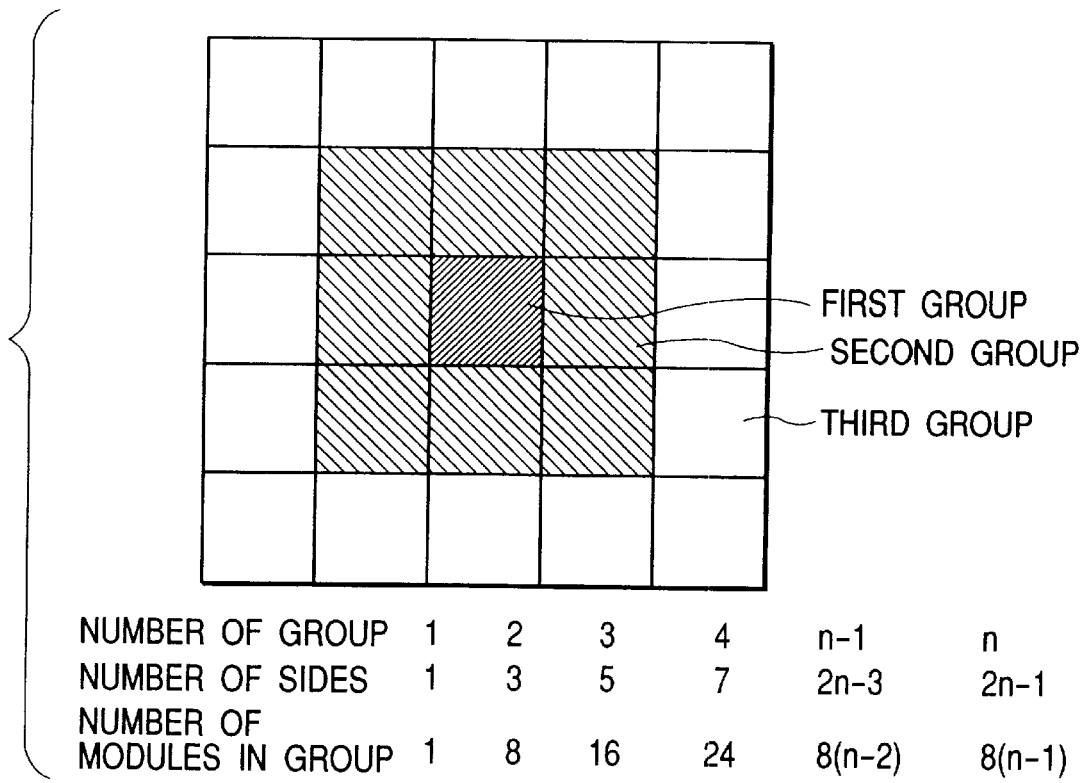
FIG. 5 is a plan view showing a modification of the first embodiment.

In this embodiment, although the 3×3 module array is used, other arrays with more modules may also be used by using the modules A to C of three different types. For example, as shown in FIG. 5, an innermost module belongs to a first group, modules arranged around the innermost module belong to a second group, modules arranged around the second group modules belong to a third group. In the same manner, fourth to n-th groups are defined. This module array has the modules of the first to n-th group and one side of the n-th group has (2n-1) modules, thus forming a (2n-1)×(2n-1) array. The numbers of modules of respective groups are 1 to 8(n-1).

The feature of this embodiment resides in that modules are symmetrically arranged relative to the central module, and three-dimensional form a pyramid shape.

After the modules were assembled, as the scintillator 103, 203 for converting X-rays into visual light, a fluorescent screen 203 made of $Gd_2O_2S$: Tl was arranged on the fiber plates 107, 207 covering the whole pixel area. The material of the scintillator 103, 203 is not limited only to $Gd_2O_2S$: Tl. For example, CsI (caesium iodide) may be vapor deposited on the fiber plates. As the fiber array, a fiber plate of an integrated type made of scintillation fibers may also be used.

The operation of the panel display will be described with reference to FIGS. 4A and 4B. X-rays incident upon the fiber array 202 as first order radiation waves, are absorbed by the scintillator 203 and converted into second order radiation waves. X-rays not absorbed by the scintillator 203 are almost perfectly absorbed in the fiber plate 207 containing lead particles. The fiber array 202 has a transmission factor of near 100% as to visual light converted by the scintillator 203.

A flat panel type two-dimensional image input apparatus having an image read area of 40 cm square was formed as described above.

The large area panel has the central module arranged in the central area of the image read area. Therefore, the coupling area between modules is not present in the central area of the image read area from which important image information is often obtained. Thus, the problem of the prior art can be solved.

If this large area two-dimensional image input apparatus is used in the medical field, the dose of X-rays is required to be made as small as possible in order to radiate a small amount of X-rays to human body. Therefore, the amount of visual light generated by the scintillator (fluorescent member) which absorbs X-rays is generally small, and also the charge amount generated by the photoelectric conversion element from the received visual light is also small. In order to obtain a fine image from small signals, the electrical mounting is required to be made compact, such as shortening a wiring length so as to prevent noises from superposing upon an analog signal wiring line led from the panel. In this embodiment, the electrical mounting area of each module in the panel can be arranged in four directions. The degree of design freedom is therefore large and the electrical mounting most suitable for small signals can be achieved.

The area sensor of the module is covered with the fiber array. It is therefore possible to prevent X-ray damages of photodiodes and transistors constituting the pixels in the area sensor and of shift registers and amplifiers constituting the peripheral circuit.

The fiber array having a sufficient thickness of X-ray shielding member can prevent X-ray damages of ICs and the like of the signal processing circuit formed in the electrical mounting area of the module.

In this embodiment, the large area image input apparatus compatible with moving images uses large-substrate CMOS area sensors. Other sensors may also be used for specific use fields. For example, conventional a-Si sensors may be used. Although a combination of only four sensors is possible according to conventional techniques, more sensors can be combined to form a larger area panel.

Figure 7A:
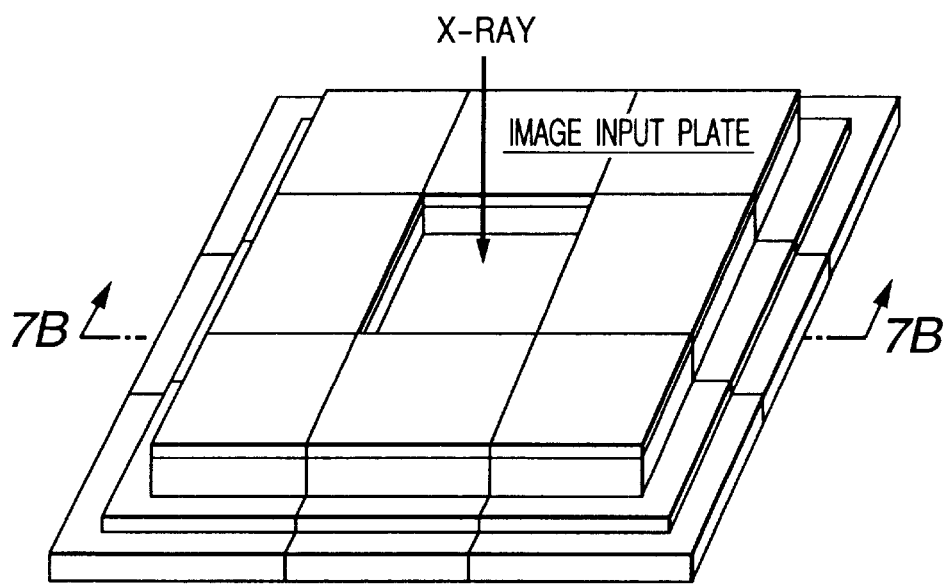
FIGS. 7A and 7B are a perspective view and a cross sectional view showing an image input apparatus according to a second embodiment of the invention.
Figure 7B:
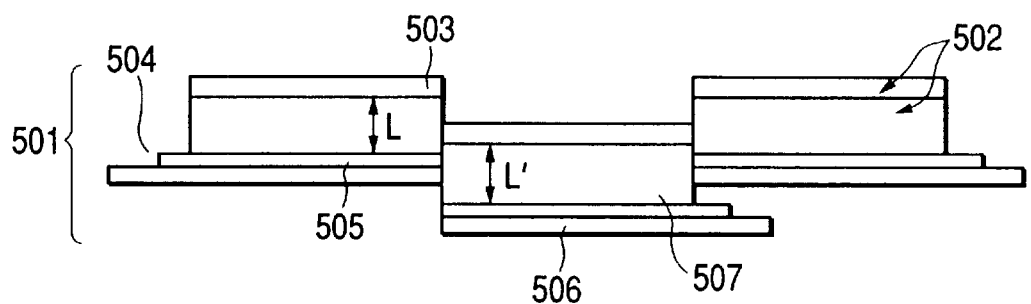

FIGS. 7A and 7B show a two-dimensional image input apparatus according to a second embodiment of the invention. FIG. 7A is a perspective view of the image input apparatus, and FIG. 7B is a cross sectional view taken along a line 7B—7B shown in FIG. 7A.

In FIGS. 7A and 7B, each module 501 is constituted of a module substrate 506, an area sensor 505 formed on the module substrate 506 and including a pixel area and a non-pixel area, a fiber plate 507 and a scintillator 503. The fiber plate 507 includes a fiber array 502. The scintillator 503 serving as an image input surface converts X-rays into visual light, and the fiber plate 507 transmits the visual light to the area sensor 505.

Modules 501 with area sensors 505 of three different types are used similar to the first embodiment. The shape of the pixel area of the area sensor 505 is a square of m×m (in this embodiment, m–1350).

In this embodiment, modules of three types A, B and C are used. Similar to the module shown in FIGS. 4A and 4B, each module 501 is constituted of a module substrate 506, an area sensor 505, a fiber array 502 and the like. In the electrical mounting area of the module substrate, a circuit for processing signals from the area sensor 505 and other circuits are formed as hybrid circuits. Also in this area, bonding pads are formed for electrical connections between these circuits and the power source lines, signal lines and the like of the area sensor 505.

In this embodiment, as the scintillator for converting X-rays into visual light, a fluorescent screen scintillator 503 made of $Gd_2O_2S$: Tl is arranged on the fiber plates 507 of the modules 501. The material of the scintillator 503 is not limited only to $Gd_2O_2S$: Tl. For example, CsI (caesium iodide) may be vapor deposited on the fiber plates 507. As the fiber array 502, a fiber plate of an integrated type made of scintillation fibers may also be used.

In this embodiment, the thickness of the fiber array 502 of each module 501 is the same (L=L' as shown in FIG. 7B). The feature of this embodiment resides in this structure together with the following module layout.

The modules A and C are arranged at each corner of the image input surface. The module B is arranged between the modules A and C. In this embodiment, these modules are combined to form a 3×3 array such as shown in FIG. 3A which array is representative of the whole structure of the embodiment. The central module belongs to a first group, and the peripheral eight modules belong to a second module. The feature of this embodiment resides in the module layout that one module is arranged in the central area.

The modules of the second group are arranged along the four sides of the pixel area of the central module of the first group. In this case, each module is arranged so that the vertical pixel lines and horizontal pixel lines become continuous as viewed along the X-ray incidence direction. The modules of the second group are arranged on the same plane which is different from the plane on which the central module of the first group is arranged. Therefore, the central module of the first group is arranged at the lower position as shown in FIG. 7B of the cross sectional view of a display panel with these modules. The electrical mounting area with a read circuit and bonding pads can be arranged separately for each pixel area, while all pixel areas are arranged continuously over the whole panel area. Therefore, electrical mounting becomes easy.

In this embodiment, although the 3×3 module array is used, other arrays with more modules may also be used such as shown in FIG. 5 and having generally a (2n-1)×(2n-1) array. The feature of this embodiment resides in that modules are symmetrically arranged relative to the central module, and three-dimensional form a pyramid shape.

A flat panel type two-dimensional image input apparatus having an image read area of 40 cm square was formed as described above.

The large area panel has the central module arranged in the central area of the image read area. Therefore, the coupling area between modules is not present in the central area of the image read area from which important image information is often obtained.

If this large area two-dimensional image input apparatus is used in the medical field, the dose of X-rays is required to be made as small as possible in order to radiate a small amount of X-rays to human body. Therefore, the amount of visual light generated by the scintillator (fluorescent member) which absorbs X-rays is generally small, and also the charge amount generated by the photoelectric conversion element from the received visual light is small. In order to obtain a fine image from small signals, the electrical mounting is required to be made compact, such as shortening a wiring length so as to prevent noises from superposing upon an analog signal wiring line led from the panel. In this embodiment, the electrical mounting area of each module in the panel can be arranged in four directions. The degree of design freedom is therefore large and the electrical mounting most suitable for small signals can be achieved.

In the CMOS area sensor of this embodiment, X-ray damages are likely to be formed in photodiodes and transistors constituting the pixels and in shift registers and amplifiers constituting the peripheral circuit. This damages are common in all devices made of silicon crystals. Even if the fiber array for absorbing X-rays is arranged on the upper surface of the area sensor, it is not possible to perfectly absorb transmitting X-rays. Very strong X-rays are used in the industrial field in some cases. If the thickness of the fiber array of each module is different, the degree of degradation of each module after a long term use becomes different. In this embodiment, a variation in the degradation degree of modules can be made small since the fiber array having the same thickness is used for both the central module and peripheral modules.

The fiber array having a sufficient thickness of X-ray shielding member can prevent X-ray damages of ICs and the like of the signal processing circuit formed in the electrical mounting area of the module.

In this embodiment, the large area image input apparatus compatible with moving images use large CMOS area sensors. Other sensors may also be used for specific use fields. For example, conventional a-Si sensors may be used. Although a combination of only four sensors is possible according to conventional techniques, more sensors can be combined to form a larger area panel.

Figure 8A:
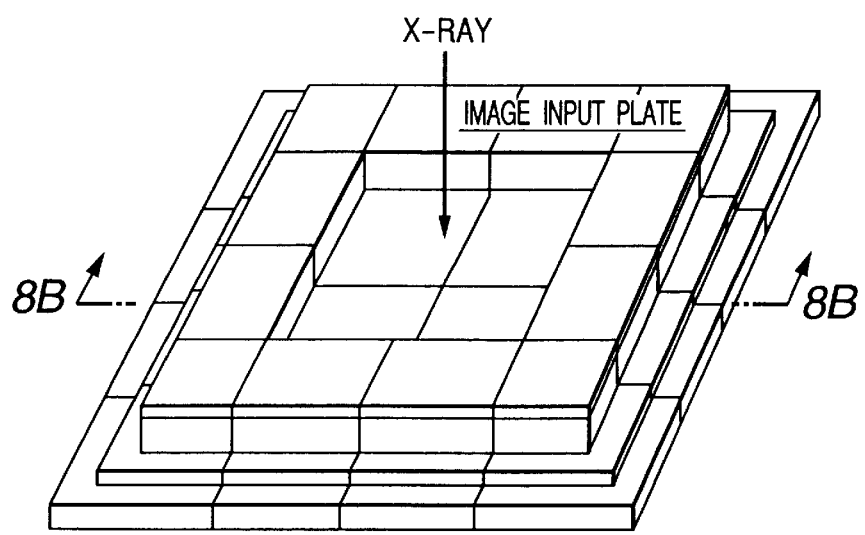
FIGS. 8A and 8B are a perspective view and a cross sectional view showing an image input apparatus according to a third embodiment of the invention.
Figure 8B:
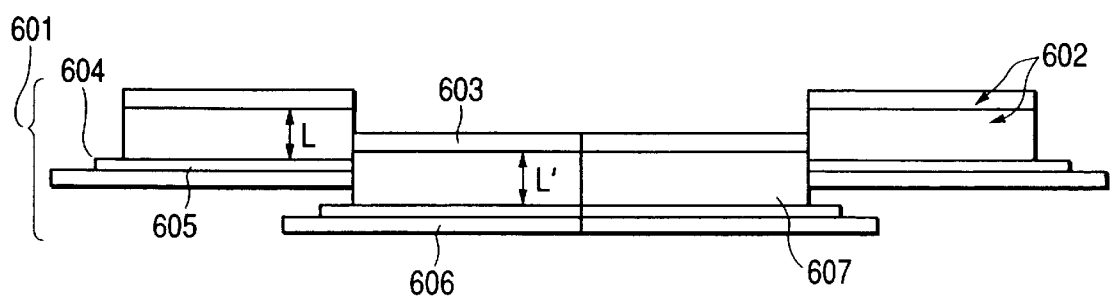

FIGS. 8A and 8B show a two-dimensional image input apparatus according to a third embodiment of the invention. FIG. 8A is a perspective view of the image input apparatus, and FIG. 8B is a cross sectional view taken along a line 8B—8B shown in FIG. 8A.

In FIGS. 8A and 8B, each module 601 is constituted of a module substrate 606, an area sensor 605 formed on the module substrate 606 and including a pixel area and a non-pixel area, a fiber plate 607 and a scintillator 603. The fiber plate 607 includes a fiber array 602 transmits the visual light. The scintillator 603 serving as an image input surface converts X-rays corresponding to the area sensor 605 into visual light. The two-dimensional image input apparatus of this embodiment has four modules in a central area and twelve modules around the four central modules.

The area sensors 605 of three different types similar to the first embodiment are used. The shape of the pixel area of the area sensor 605 is a square of m×m (in this embodiment, m=1350).

In this embodiment, modules of three types A, B and C are used. Similar to the module shown in FIGS. 4A and 4B, each module 601 is constituted of a module substrate 606, an area sensor 605, a fiber array 602 and the like. In the electrical mounting area of the module substrate, a signal processing circuit for processing signals from the area sensor 605 and other circuits are formed as hybrid circuits. Also in this area, bonding pads are formed for electrical connections between these circuits and the power source lines, signal lines and the like of the area sensor 605.

In this embodiment, as the scintillator 603 for converting X-rays into visual light, a fluorescent screen made of $Gd_2O_2S$: Tl is arranged on the pixel area over the fiber plates 607 of the modules 601. The material of the scintillator 603 is not limited only to $Gd_2O_2S$: Tl. For example, CsI (caesium iodide) may be vapor deposited on the fiber plates 607. As the fiber array 602, a fiber plate of an integrated type made of scintillation fibers may also be used. The scintillation fiber is a fiber mixed with material capable of absorbing X-rays and converting the X-rays into visible light.

In this embodiment, the thickness of the fiber array of each module is the same (L=L' as shown in FIG. 8B). The feature of this embodiment resides in this structure together with the following module layout.

The modules A and C are arranged at each corner of the image input surface. The module B is arranged between the modules A and C. The layout of the modules B are characteristic to this embodiment. In this embodiment, these modules are combined to form a 4×4 array shown in FIG. 8A which array is a typical example of the whole structure of the embodiment. The central first to fourth modules belong to a first group, and the peripheral twelve modules belong to a second module. The modules of the second group are arranged along the four outer sides of the pixel areas of the central modules of the first group. In this case, each module is arranged so that the vertical pixel lines and horizontal pixel lines become continuous as viewed along the X-ray incidence direction. The modules of the second group are arranged on the same plane which is different from the plane on which the central module of the first group is arranged.

Figure 9:
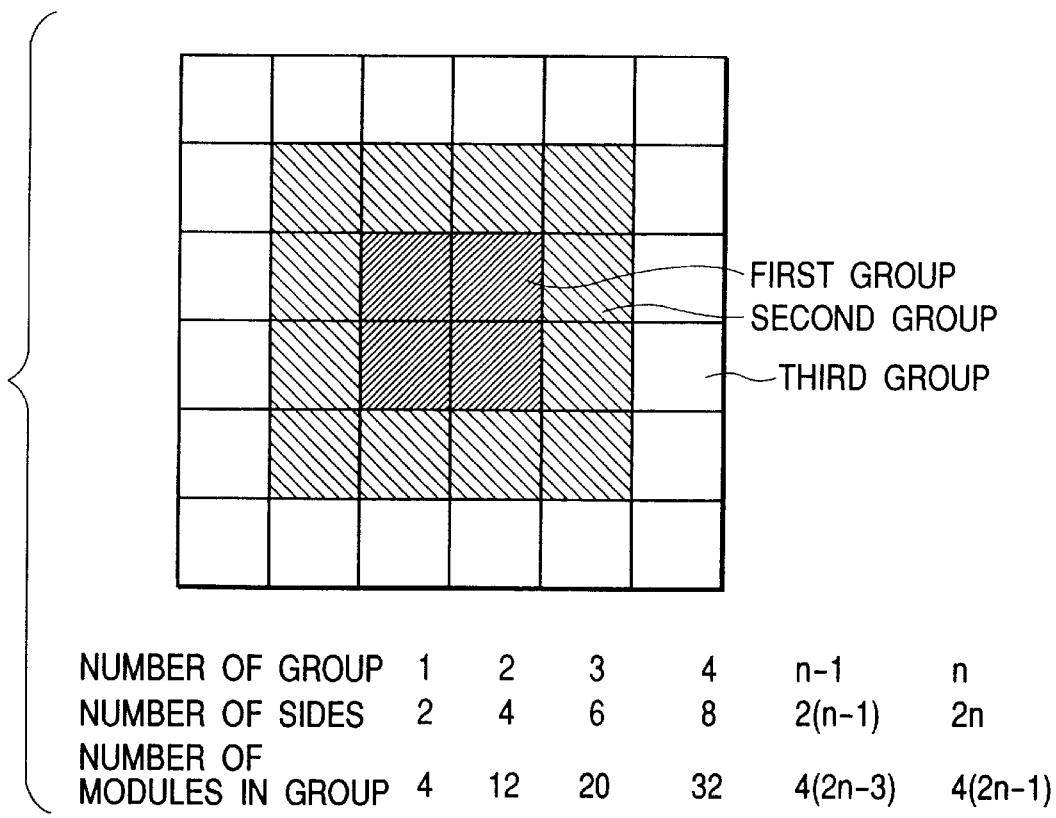
FIG. 9 is a plan view showing a modification of the third embodiment.

Therefore, the central modules of the first group are arranged at the lower position as shown in FIG. 8B of the cross sectional view of a display panel with these modules. Only the method of stepwise disposing area sensors or modules is well known techniques. The electrical mounting area with a read circuit and bonding pads can be arranged separately for each pixel area, while all pixel areas are arranged continuously over the whole panel area. Therefore, electrical mounting becomes easy. In this embodiment, although the 4×4 module array is used, other arrays with more modules may also be used such as shown in FIG. 9 and having generally a (4n)×(4n) array. As shown in FIG. 9, the number of first group modules is 2 at each side and 4 in total. The numbers of second group modules, . . . , n-th group modules are 4, . . . , 2n at each side and 12, . . . , 4(2n-1) in total respectively. The feature of this embodiment resides in that modules are symmetrically arranged relative to the central modules, and three-dimensional form a pyramid shape.

A flat panel type two-dimensional image input apparatus having an image read area of 40 cm square was formed as described above.

If this large area two-dimensional image input apparatus is used in the medical field, the dose of X-rays is required to be made as small as possible. Therefore, the amount of visual light generated by the scintillator (fluorescent member) which absorbs X-rays is generally small, and also the charge amount generated by the photoelectric conversion element from the received visual light is small. In order to obtain a fine image from small signals, the electrical mounting is required to be made compact, such as shortening a wiring length so as to prevent noises from superposing upon an analog signal wiring line led from the panel.

In this embodiment, the electrical mounting area of each module in the panel can be arranged in four directions. The degree of design freedom is therefore large and the electrical mounting most suitable for small signals can be achieved.

The first group modules are arranged in the central area of the image input area, and the second group modules are arranged around the first group modules. The second group modules are arranged on the front side, and the first group modules are arranged on the back side. Accordingly, lead wires from modules of the first and second groups can be routed with a sufficient margin.

In the CMOS area sensor of this embodiment, X-ray damages are likely to be formed in photodiodes and transistors constituting the pixels and in shift registers and amplifiers constituting the peripheral circuit. This damages are common in all devices made of silicon crystals. Even if the fiber array for absorbing X-rays is arranged on the upper surface of the area sensor, it is not possible to perfectly absorb transmitting X-rays. Very strong X-rays are used in the industrial field in some cases. If the thickness of the fiber array of each module is different, the degree of degradation of each module after a long term use becomes different. In this embodiment, a variation in the degradation degree of modules can be made small since the fiber array having the same thickness is used for both the central modules and peripheral modules.

The fiber array having a sufficient thickness of X-ray shielding member can prevent X-ray damages of ICs and the like of the signal processing circuit formed in the electrical mounting area of the module.

In this embodiment, the large area image input apparatus compatible with moving images use large-substrate CMOS area sensors. Other sensors may also be used for specific use fields. For example, conventional a-Si sensors may be used. Although a combination of only four sensors is possible according to conventional techniques, more sensors can be combined to form a larger area panel.

As described above, according to the first to third embodiments, modules are arranged symmetrically to a central module or modules like a concave shape. Accordingly, an assembly process is easy and a number of modules can be combined.

Since a large area two-dimensional image input apparatus can be formed by a combination of modules of three different types, the design of each module is easy, the degree of design freedom increases, and hybrid circuits can be used with ease.

Since the fiber array absorbs X-rays, the area sensor can be prevented from X-ray damages. Additional X-ray shielding members for protecting ICs and the like on the module are not necessary so that the weight of the apparatus can be reduced.

Figure 10A:
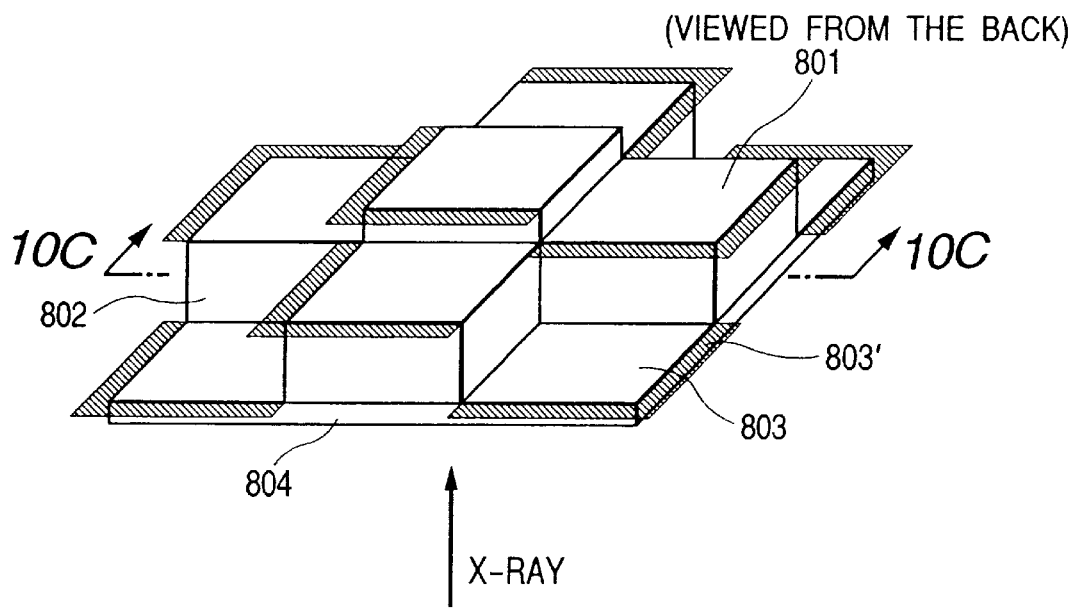
FIGS. 10A, 10B, 10C and 10D are diagrams illustrating a fourth embodiment of the invention.
Figure 10B:
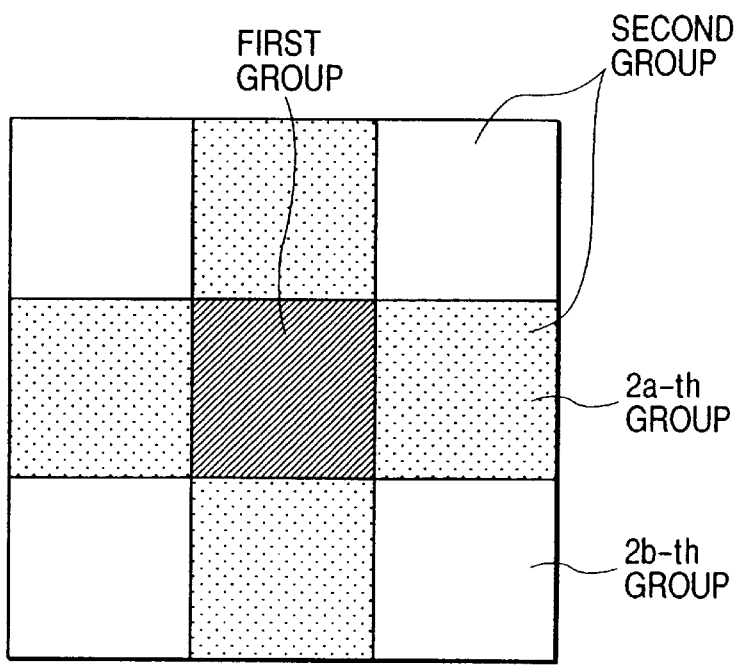

FIGS. 10A and 10B are diagrams illustrating a fourth embodiment. FIG. 10A is a perspective view of an image input apparatus of the fourth embodiment and FIG. 10B is a plan view showing the layout of modules.

Referring to FIGS. 10A and 10B, an area sensor 801 has a pixel area 803 in which pixels are arranged in vertical and horizontal directions and a non-pixel area 803'. In this embodiment, area sensors of two different types are used. An area sensor with the non-pixel area 803' formed along two sides crossing at a right angle can be used. The area sensor is cut from one wafer such as shown in FIG. 6. Formed in the non-pixel area 803' are scan circuits such as vertical and horizontal shift registers, multiplexers, read amplifiers, and external terminals. In FIGS. 10A, the module substrate and the like are omitted. Electrical connection bumps are formed in an external terminal area of the area sensor, and electrically connected to external terminals of the module substrate through tab connection. With tab connection, a thickness of an connection region between bumps and tabs can be set to about 50 µm. In this embodiment using fiber plates 802 in a multi-step structure, a difference in thickness between fiber plates can be made small and a thickness of the apparatus can be made smaller than when wire bonding is used (details will be later given).

A scintillator 804 serving as an image input surface will be described. As a scintillator for converting X-rays into visual light, a fluorescent screen made of $Gd_2O_2S$: Tl is arranged on the whole pixel area over the fiber plates of the modules. The material of the scintillator 603 is not limited only to $Gd_2O_2S$: Tl. It is preferable that the scintillator has a radiation wavelength matching the spectral sensitivity of a CMOS sensor. CsI (caesium iodide) may be vapor deposited on the fiber plates. Scintillator particles such as $Gd_2O_2S$ mixed with resin may be directly coated on the fiber plates. With vapor deposition or coating, the scintillator layer can be formed smoothly on the fiber plate even if it has any step, because the deposition or coating fills the step with scintillation material. This vapor deposition or coating is suitable in case of that this embodiment is combined with the second embodiment.

In this embodiment, the fiber array of the module of two different thicknesses are used, one of 3 mm thickness and the other of 4 mm thickness. The feature of the embodiment resides in this module structure together with the following module layout.

Modules A and C with area sensors and the like similar to those of the first embodiment are used. Similar to the first embodiment, each module is constituted of a module substrate, an area sensor, a fiber array (scintillator 804 and fiber plate 802), and the like. In the electrical mounting area of the module substrate, a signal processing circuit for processing signals from the area sensor 605 and other circuits are formed as hybrid circuits. A module substrate may be a substrate made of a plurality of substrates and may be designed as desired in accordance with each embodiment of the image input apparatus. In the electrical mounting area of the module substrate, tabs are formed for electrical connections between these circuits and the power source lines, signal lines and the like of the area sensor. The fiber plate of the fiber array may be made of an integral plate of a plurality of fiber plates adhered each other.

In this embodiment, as shown in FIG. 10B, the modules belong to a first group and a second group (2a-th group and 2b-th group).

In this embodiment, the 2b-th group modules are not provided with a fiber plate. Since a CMOS sensor made of single crystal silicon is likely to have X-ray damages, the structure with a fiber plate is preferable in terms of X-ray shielding. If a fiber plate is used for X-ray shielding, a thickness of about 3 mm is required. In this embodiment, a combination of these modules forms a 3×3 module array.

As shown in FIG. 10B, the central module belongs to the first group and the peripheral eight modules belong to the second groups. The second groups include the 2a-th group and 2b-th group. These modules of the second groups are arranged so that their non-pixel areas do not overlap with each other. In this embodiment, the module groups are arranged at three different height positions in a pyramid shape.

The pixel areas formed by the 2a-th module group are arranged on the same plane which is different from the plane where the pixel area formed by the first module group is arranged. These modules of the 2a-th and 2b-th groups are arranged so that their non-pixel areas do not overlap with each other. The pixel areas of the 2a-th group modules are arranged on the same plane which is different from the planes where the pixel areas formed by the first and 2a-th groups are arranged.

Modules of each group are arranged so that the vertical pixel lines and horizontal pixel lines become continuous as viewed along the X-ray incidence direction (image input direction). The electrical mounting area with a read circuit and tabs can be arranged separately for each pixel area, while all pixel areas are arranged continuously over the whole panel area. Therefore, electrical mounting becomes easy.

The feature of this embodiment resides in that modules are symmetrically arranged relative to the central module, and three-dimensional form a pyramid shape.

As described above, the large area panel has the central module arranged in the central area of the image read area. Therefore, the coupling area between modules is not present in the central area of the image read area from which important image information is often obtained.

In order to obtain a fine image from small signals, the electrical mounting is required to be made compact, such as shortening a wiring length so as to prevent noises from superposing upon an analog signal wiring line led from the panel. In this embodiment, the electrical mounting area of each module in the panel can be arranged in four directions. The degree of design freedom is therefore large and the electrical mounting most suitable for small signals can be achieved.

A printed circuit board (PCB) or the like on which an area sensor power source circuit, a signal processing circuit for the area sensor and the like are mounted, can be mounted on the bottom (opposite to the X-ray incidence plane) of each module. An image input apparatus more compact can therefore be formed.

Since the area sensor has the non-pixel area formed on two sides crossing at a right angle, the design for sensor circuits and the like on a wafer can be made easily.

Figure 10C:
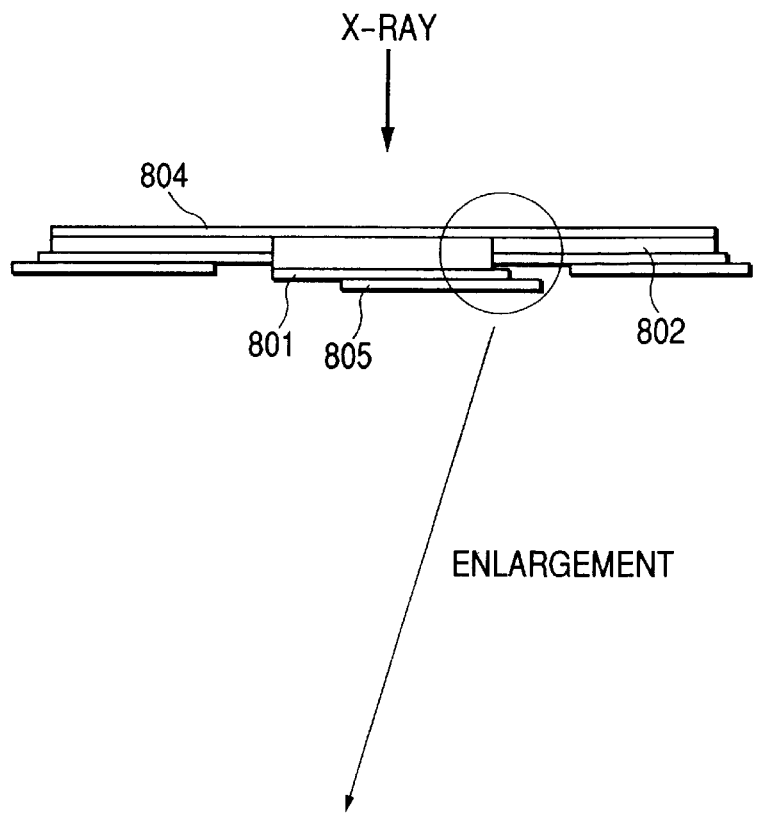

Next, this embodiment will be further detailed with reference to FIGS. 10C and 10D. FIG. 10C is a cross sectional view taken along a line 10C—10C shown in FIG. 10A, and FIG. 10D is an enlarged view showing a portion of FIG. 10C.

The CMOS area sensor and module substrate 805 are assembled by using bumps 806 and tabs 807. In the non-pixel area of the area sensor 801, electrical connection bumps are formed which are connected to external terminals or tabs of the module substrate through tab connection. With tab connection, a thickness of an connection region between bumps and tabs can be set to about 50 µm. In this embodiment using fiber plates 802 in a multi-step structure, a difference in thickness between fiber plates can be reduced and a thickness of the apparatus can be made smaller than when wire bonding is used.

In consideration of easy mounting, in this embodiment, the thicknesses of the fiber plates are set to L'=3 mm and L=4 mm, with a difference of 1 mm therebetween. The thickness of the area sensor is 500 µm, and in this space of 500 µm the area sensor and tabs on the module substrate are electrically connected. Theoretically, a difference in thickness between the fiber plates can be made approximately a sum of the thickness of 50 µm of the connection region between bumps and tabs and the thickness of the area sensor (finished wafer). Since the area sensor can be thinned to about 50 µm by polishing the bottom surface thereof, the difference in thickness between the fiber plates can be reduced to about 100 µm. This difference in thickness between the fiber plates can be formed by polishing the surface of the fiber plate. A process of polishing the surface of a fiber plate is usually executed. Therefore, even if the thickness of a fiber plate is changed by polishing, the process cost does not change. The fiber plate having a thickness of 3 mm shown in FIG. 10D may be polished by 100 µm to attain use of a fiber plate having a smaller thickness.

Figure 10D:
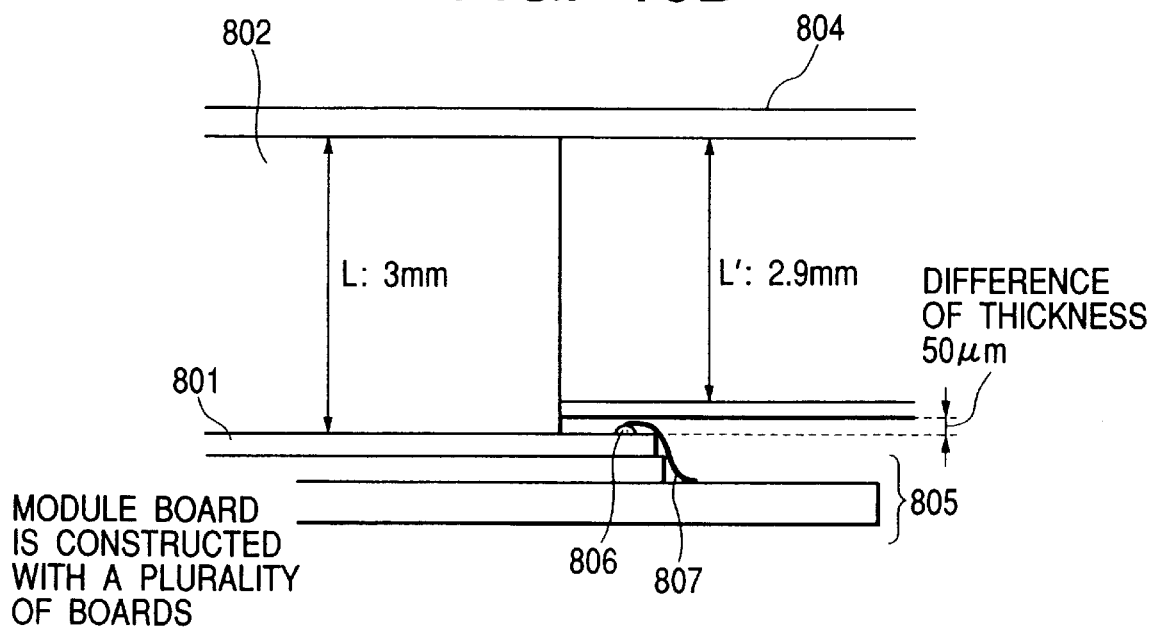

In FIG. 10D, the thicknesses of the fiber plates are shown emphasized. One CMOS sensor of 140 mm square is cut from an 8-inch wafer. By using 3×3=9 CMOS sensors, the modules of a three-step structure is formed. In this manner, the image read area (image input plane) of 40 cm square can be realized and the total thickness of the apparatus is 50 mm. A thin, flat panel type, two-dimensional image input apparatus is able to be realized.

Since CMOS sensors are used, random access and non-destructive read are possible. A large area image input apparatus can be realized which can provide a high performance, high speed operation and versatile functions and can switch between a still image sensing mode and a moving image sensing mode. A CMOS sensor consumes power by about one digit less than a CCD sensor and thus generates less heat so that it is preferable to use CMOS sensors for a large image input apparatus of this embodiment.

An image formed by pixel areas of respective modules has a high quality without coupling areas of the image.

A straight type fiber plate can be used which can be worked easier and manufactured with lower cost than a taper type fiber plate.

Figure 11A:
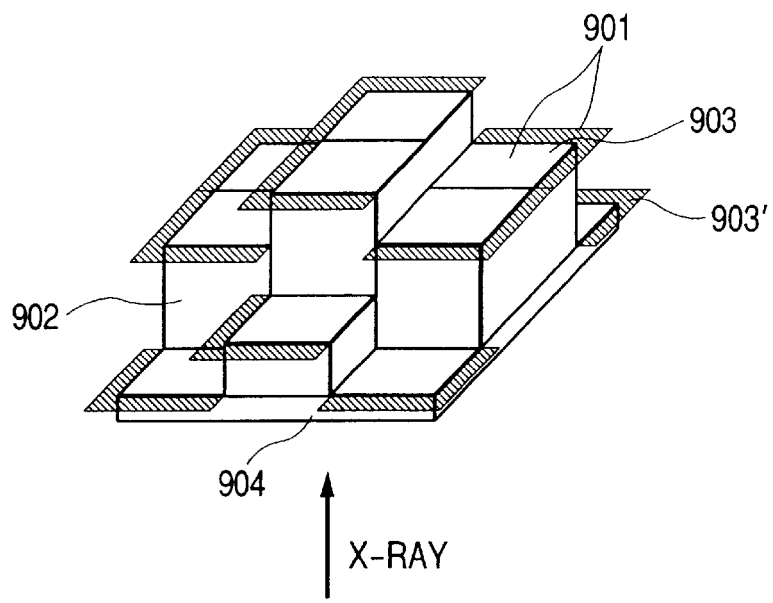
FIGS. 11A and 11B are diagrams illustrating a fifth embodiment of the invention.
Figure 11B:
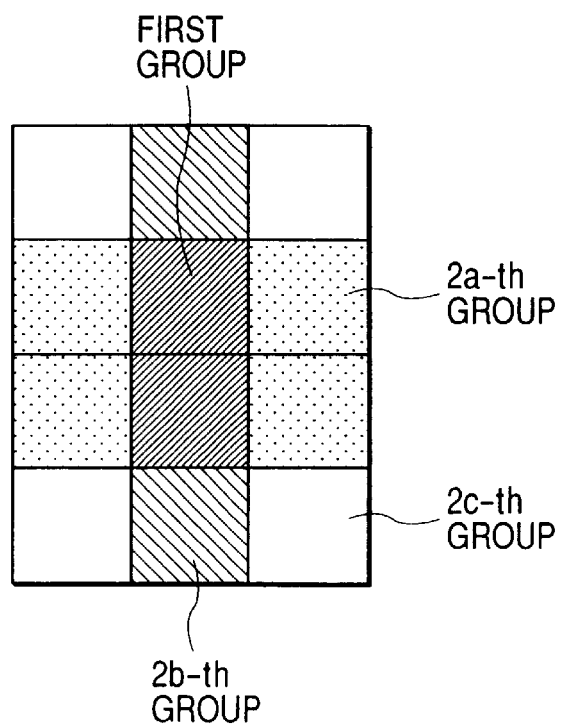

FIGS. 11A and 11B are diagrams illustrating a fifth embodiment of the invention. FIG. 11A is a perspective view of an image input apparatus of the fifth embodiment and FIG. 11B is a plan view showing the layout of modules.

Referring to FIGS. 11A and 11B, area sensors 801 of two types similar to the fourth embodiment are used.

The structure of the module is the same as the fourth embodiment. In this embodiment, three different thicknesses are used for the fiber array of the module. The feature of the embodiment resides in this module structure together with the following module layout. These modules constitute first and second (2a-th, 2b-th and 2c-th) groups.

In this embodiment, although the 2c-th group modules are not provided with a fiber plate, they may be provided with fiber plates for X-ray shielding.

In this embodiment, a combination of these modules forms a 3×3 module array.

As shown in FIG. 11B, central two modules belong to the first group and the peripheral ten modules belong to the second groups. The second groups include the 2a-th, 2b-th and 2c-th groups. These modules of the second groups are arranged so that their non-pixel areas do not overlap with each other.

In this embodiment, the module groups are arranged at four different height positions in a pyramid shape.

The modules of the 2a-th group are arranged along opposing two sides of the pixel areas formed by the first group modules. The pixel areas formed by the 2a-th module group are arranged on the same plane which is different from the plane where the pixel area formed by the first module group is arranged. The 2b-th group modules are arranged so that the non-pixel areas of the 2a-th and 2b-th group modules do not overlap with each other. The pixel areas formed by the 2b-th module group are arranged on the same plane which is different from the planes where the pixel areas formed by the first and 2a-th module groups are arranged. The 2c-th group modules are arranged so that the non-pixel areas of the 2b-th and 2c-th group modules do not overlap with each other. The pixel areas formed by the 2c-th module group are arranged on the same plane which is different from the planes where the pixel areas formed by the first, 2a-th and 2b-th module groups are arranged.

Modules of each group are arranged so that the vertical pixel lines and horizontal pixel lines become continuous as viewed along the X-ray incidence direction. The electrical mounting area with a read circuit and bonding pads can be arranged separately for each pixel area, while all pixel areas are arranged continuously over the whole panel area. Therefore, electrical mounting becomes easy.

The feature of this embodiment resides in that modules are symmetrically arranged relative to the central modules, and three-dimensional form a pyramid shape.

A flat panel type two-dimensional image input apparatus having an image read area of 40 cm square was formed as described above.

In order to obtain a fine image from small signals, the electrical mounting is required to be made compact, such as shortening a wiring length so as to prevent noises from superposing upon an analog signal wiring line led from the panel. In this embodiment, the electrical mounting area of each module in the panel can be arranged in four directions. The degree of design freedom is therefore large and the electrical mounting most suitable for small signals can be achieved. Although the thickness of the module at the highest step becomes slightly large, the total thickness of the apparatus can be prevented from becoming thick, if the space on the bottom side of the area sensor is used effectively for electrical mounting.

Since the area sensor has the non-pixel area formed on two sides crossing at a right angle, the design for sensor circuits and the like on a wafer can be made easily.

Also in this embodiment, if bumps and tabs are used for electrically connecting the area sensor and module substrate, as described in the fourth embodiment, the difference in thickness between the fiber plates can be minimized. Therefore, even if the number of steps increases, the total thickness of the apparatus can be prevented from becoming large. A compact flat panel type image input apparatus can therefore be realized.

In this embodiment, since an image input surface larger than 40 cm×53 cm can be realized, the apparatus can be applied not only to medical fields but also to nondestructive inspection of an object having a large area.

Also in this embodiment, since CMOS sensors are used, random access and non-destructive read are possible. A large area image input apparatus can be realized which can provide a high performance, high speed operation and versatile functions and can switch between a still image sensing mode and a moving image sensing mode. A CMOS sensor consumes power by about one digit less than a CCD sensor. Low consumption power and low heat generation are suitable for a large area nondestructive image input apparatus of an outdoor type.

Figure 12A:
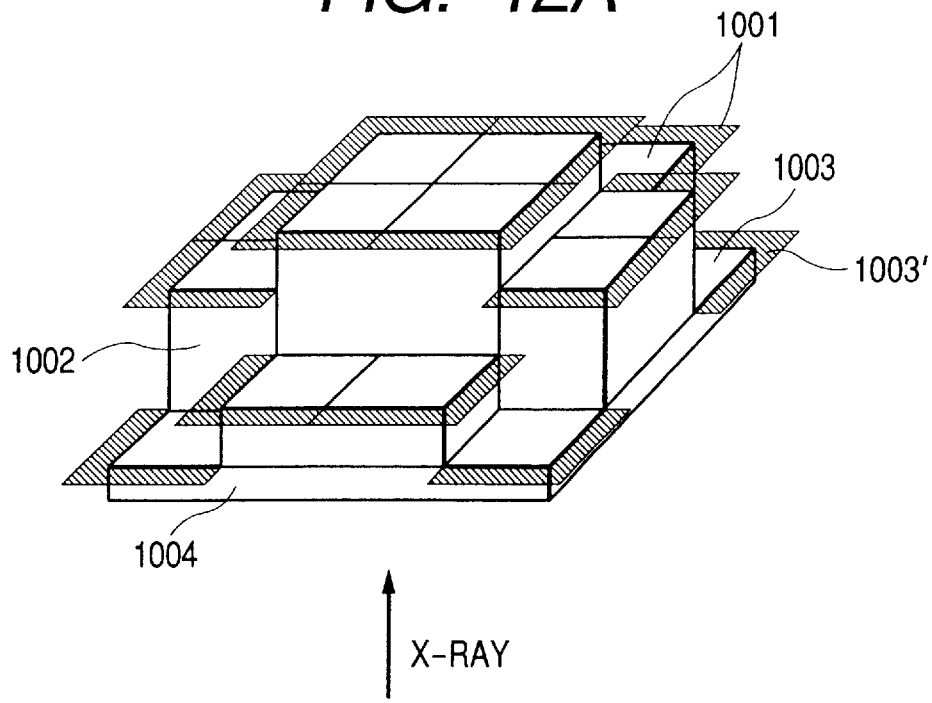
FIGS. 12A and 12B are diagrams illustrating a sixth embodiment of the invention.
Figure 12B:
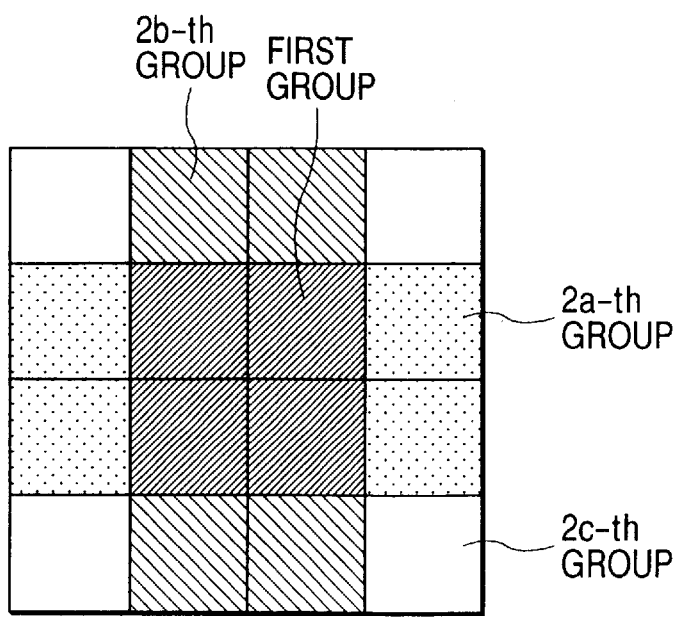

FIGS. 12A and 12B are diagrams illustrating a sixth embodiment of the invention. FIG. 12A is a perspective view of an image input apparatus of the sixth embodiment and FIG. 12B is a plan view showing the layout of modules.

Referring to FIGS. 12A and 12B, area sensors 1001 of two types similar to the fourth embodiment are used.

The structure of the module is the same as the fourth embodiment. In this embodiment, three different thicknesses are used for the fiber array of the module. The feature of the embodiment resides in this module structure together with the following module layout. These modules constitute first and second (2a-th, 2b-th and 2c-th) groups.

In this embodiment, although the 2c-th group modules are not provided with a fiber plate, they may be provided with fiber plates for X-ray shielding.

In this embodiment, a combination of these modules forms a 3×3 module array.

As shown in FIG. 12B, central four modules belong to the first group and the peripheral twelve modules belong to the second groups. The second groups include the 2a-th, 2b-th and 2c-th groups. These modules of the second groups are arranged so that their non-pixel areas do not overlap with each other.

In this embodiment, the module groups are arranged at four different height positions in a pyramid shape.

The modules of the 2a-th group are arranged along opposing two sides of the pixel areas formed by the first group modules. The pixel areas formed by the 2a-th module group are arranged on the same plane which is different from the plane where the pixel area formed by the first module group is arranged. The 2b-th group modules are arranged so that the non-pixel areas of the 2a-th and 2b-th group modules do not overlap with each other. The pixel areas formed by the 2b-th module group are arranged on the same plane which is different from the planes where the pixel areas formed by the first and 2a-th module groups are arranged. The 2c-th group modules are arranged so that the non-pixel areas of the 2b-th and 2c-th group modules do not overlap with each other. The pixel areas formed by the 2c-th module group are arranged on the same plane which is different from the planes where the pixel areas formed by the first, 2a-th and 2b-th module groups are arranged.

Modules of each group are arranged so that the vertical pixel lines and horizontal pixel lines become continuous as viewed along the X-ray incidence direction. The electrical mounting area with a read circuit and bonding pads can be arranged separately for each pixel area, while all pixel areas are arranged continuously over the whole panel area. Therefore, electrical mounting becomes easy.

The feature of this embodiment resides in that modules are symmetrically arranged relative to the central modules, and three-dimensional form a pyramid shape.

A flat panel type two-dimensional image input apparatus having an image read area of 40 cm square was formed as described above.

In order to obtain a fine image from small signals, the electrical mounting is required to be made compact, such as shortening a wiring length so as to prevent noises from superposing upon an analog signal wiring line led from the panel. In this embodiment, the electrical mounting area of each module in the panel can be arranged in four directions. The degree of design freedom is therefore large and the electrical mounting most suitable for small signals can be achieved.

Since the area sensor has the non-pixel area formed on two sides crossing at a right angle, the design for sensor circuits and the like on a wafer can be made easily.

Also in this embodiment, if bumps and tabs are used for electrically connecting the area sensor and module substrate, the difference in thickness between the fiber plates can be minimized. Therefore, even if the number of steps increases, the total thickness of the apparatus can be prevented from becoming large. A compact flat panel type image input apparatus can therefore be realized.

In this embodiment, since an image input surface larger than 53 cm×53 cm can be realized, the apparatus can be applied not only to medical fields but also to nondestructive inspection of an object having a large area.

Also in this embodiment, since CMOS sensors are used, random access and non-destructive read are possible. A large area image input apparatus can be realized which can provide a high performance, high speed operation and versatile functions and can switch between a still image sensing mode and a moving image sensing mode. A CMOS sensor consumes power by about one digit less than a CCD sensor. Low consumption power and low heat generation are suitable for a large area nondestructive image input apparatus of an outdoor type.

Figure 13:
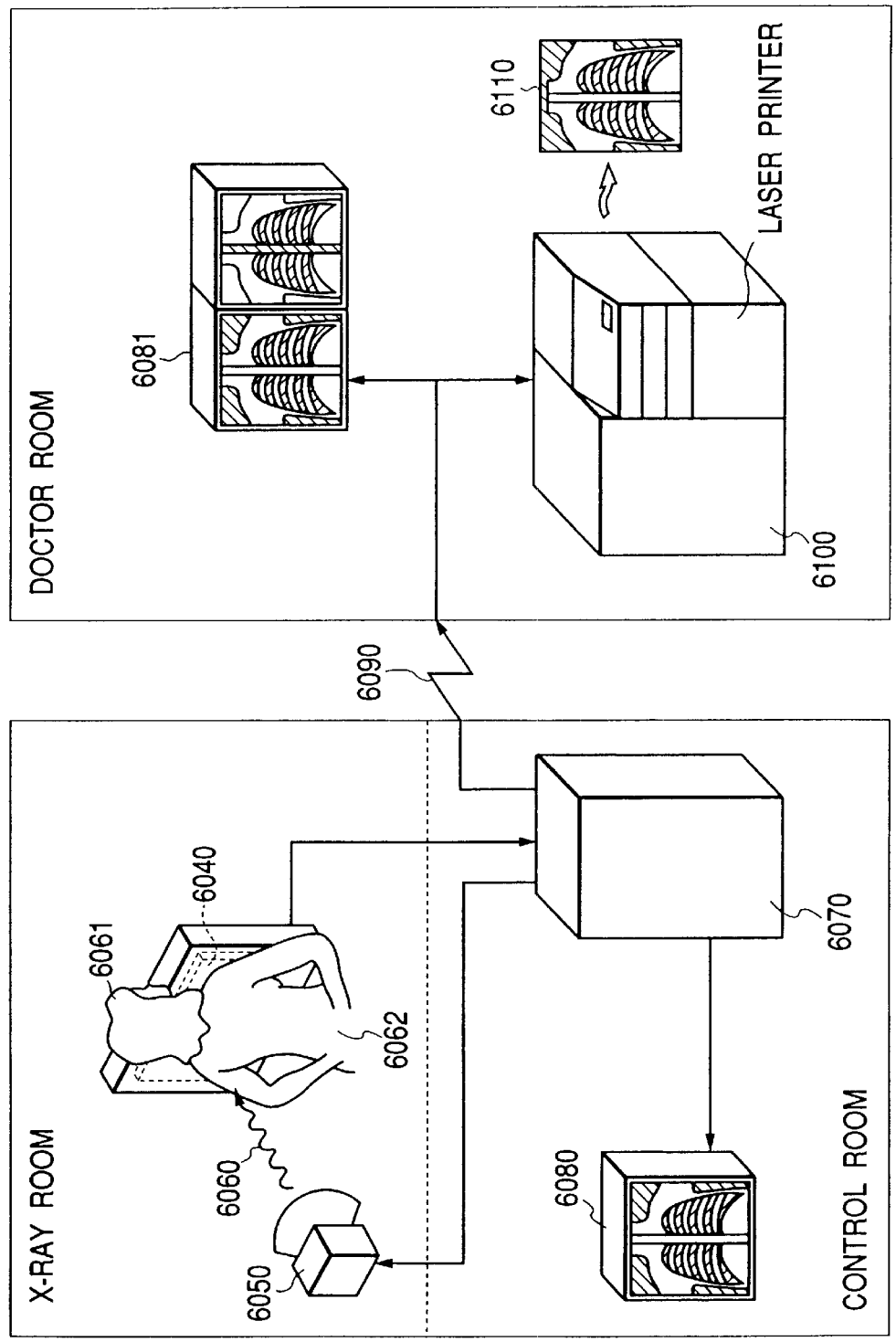
FIG. 13 is a diagram illustrating a seventh embodiment of the invention.

FIG. 13 shows an image processing system (X-ray diagnosis system) using the image input apparatus of one of the first to sixth embodiments described above.

X-rays 6060 generated by an X-ray tube 6050 transmit through a chest 6062 of a patient 6061 and become incident upon an image input apparatus 6040 mounted with the scintillator and the like according to one of the first to sixth embodiments. The X-rays incident upon the image input apparatus 6040 contain chest information of the patient 6061. In response to incidence of the X-rays, the scintillator emits light and photoelectrically converts the light into body information. This information is converted into digital signals which are processed by an image processor 6070 to be displayed on a display 6080 in a control room. The body information of the patient can be observed.

This body information may be transmitted to a remote site via transmission means such as a telephone line 6090, to be displayed on a display 6081 in a doctor room or to be stored in a storage medium such as an optical disk. In this manner, a doctor at the remote site can diagnose the patient. The body information may be stored in a film 6110 by using a film processor (laser printer) 6100.

Many widely different embodiments of the present invention may be constructed without departing from the spirit and scope of the present invention. It should be understood that the present invention is not limited to the specific embodiments described in the specification, except as defined in the appended claims.

What is claimed is:

1. An image input apparatus having a plurality of sensors each including a pixel area in which a plurality of pixels are arranged, said image input apparatus comprising:

a first group including one or a plurality of pixel areas; and a second group including a plurality of pixel areas arranged adjacently to each other surrounding said one or said plurality of pixel areas of said first group, as viewed along an image input direction, wherein said plurality of pixel areas of said second group are arranged so as to be nearer to an image input surface symmetrically with respect to said first group, than said one or said plurality of pixel areas of said first group.

2. An image input apparatus according to claim 1, wherein each sensor is contained in a sensor module including a mount area.

3. An image input apparatus according to claim 1, wherein each sensor is contained in a sensor module including a light guide portion for guiding light to the pixel area.

4. An image input apparatus according to claim 1, wherein each of the pixel areas contained in modules of said second group adjacent to two sides is arranged on a two-dimensional plane different from that of the pixel area of said second group adjacent to one side.

5. An image input apparatus according to claim 1, wherein each pixel area has a plurality of pixels arranged in vertical and horizontal directions and each sensor includes a horizontal scan circuit for scanning pixels in the horizontal direction and a vertical scan circuit for scanning pixels in the vertical direction.

6. An image input apparatus having a plurality of sensors each including a pixel area in which a plurality of pixels are arranged, each sensor being contained in a sensor module including a light guide portion for guiding light to the pixel area, said image input apparatus comprising:

a first group including one or a plurality of pixel areas; and a second group including a plurality of pixel areas arranged adjacently to each other surrounding said one or said plurality of pixel areas of said first group, as viewed along an image input direction, wherein said plurality of pixel areas of said second group are arranged so as to be nearer to an image input surface, than said one or said plurality of pixel areas of said first group, and wherein a light incidence surface of the light guide portion for guiding light to the pixel area of said first group and a light incidence surface of the light guide portion for guiding light to the pixel area of said second group are arranged on a same two-dimensional plane.

7. An image input apparatus according to claim 6, wherein the light incidence surface of the light guide portion for guiding light to the pixel area of said second group is arranged nearer to the image input surface than the light incidence surface of the light guide portion for guiding light to the pixel area of said first group.

8. An image input apparatus according to claim 7, wherein a thickness of the light guide portion for guiding light to the pixel area of said first group is equal to a thickness of the light guide portion for guiding light to the pixel area of said second group.

9. An image input apparatus having a plurality of sensors each including a pixel area in which a plurality of pixels are arranged in a square shape or a rectangle shape, said image input apparatus comprising:

a first group including one or a plurality of pixel areas; and a second group including a plurality of pixel areas arranged adjacent to said one or said plurality of pixel areas of said first group along four sides of said first group and along four diagonal directions, as viewed along an image input direction, wherein said plurality of pixel areas of said second group are arranged so as to be nearer to an image input surface symmetrically with respect to said first group, than said first group.

10. An image input apparatus according to claim 9, wherein each of the pixel areas of said second group adjacent to two sides is arranged on a two-dimensional plane different from that of the pixel area of said second group adjacent to one side.

11. An image input apparatus according to claim 9, wherein each sensor is contained in a sensor module including a mount area.

12. An image input apparatus according to claim 9, wherein each sensor is contained in a sensor module including a light guide portion for guiding light to the pixel area.

13. An image input apparatus according to claim 12, wherein a light incidence surface of the light guide portion for guiding light to the pixel area of said second group is arranged nearer to the image input surface than the light incidence surface of the light guide portion for guiding light to the pixel area of said first group.

14. An image input apparatus according to claim 9, wherein the light incidence surface of the light guide portion for guiding light to the pixel area of said second group is arranged nearer to the image input surface than the light incidence surface of the light guide portion for guiding light to the pixel area of said first group.

15. An image input apparatus according to claim 14, wherein a thickness of the light guide portion for guiding light to the pixel area of said first group is equal to a thickness of the light guide portion for guiding light to the pixel area of said second group.

16. An image input apparatus according to claim 9, wherein each pixel area has a plurality of pixels arranged in vertical and horizontal directions and each sensor includes a horizontal scan circuit for scanning pixels in the horizontal direction and a vertical scan circuit for scanning pixels in the vertical direction.

17. An image processing system comprising:

an X-ray generating unit for radiating X-rays;

an image input apparatus defined in claim 1 or 9 for receiving an X-ray image transmitted through an object; and a processing apparatus for processing a signal output from the image input apparatus.

* * * * *